(12) United States Patent
Hanya

(10) Patent No.: US 10,085,349 B2
(45) Date of Patent: Sep. 25, 2018

(54) METHOD FOR PRODUCING ELECTRONIC DEVICE, AND ELECTRONIC DEVICE

(71) Applicant: STANLEY ELECTRIC CO., LTD., Meguro-ku, Tokyo (JP)

(72) Inventor: Akihiko Hanya, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/560,445

(22) PCT Filed: Mar. 17, 2016

(86) PCT No.: PCT/JP2016/058529
§ 371 (c)(1),
(2) Date: Sep. 21, 2017

(87) PCT Pub. No.: WO2016/152728
PCT Pub. Date: Sep. 29, 2016

(65) Prior Publication Data
US 2018/0077805 A1   Mar. 15, 2018

(30) Foreign Application Priority Data

Mar. 25, 2015  (JP) ................................. 2015-063328

(51) Int. Cl.
*H01L 21/00* (2006.01)
*H05K 3/12* (2006.01)
(Continued)

(52) U.S. Cl.
CPC ........... *H05K 3/1283* (2013.01); *B22F 1/025* (2013.01); *H01B 1/22* (2013.01);
(Continued)

(58) Field of Classification Search
CPC ........... H05K 1/95; H01L 21/00; H01L 21/28; H01L 21/336; H01L 23/48; H01L 33/60
(Continued)

(56) References Cited

U.S. PATENT DOCUMENTS 8,592,814 B2 * 11/2013 Yamazaki ........... H01L 27/1225
257/43
9,812,621 B2 * 11/2017 Ishihara ................. H01L 33/60
(Continued)

FOREIGN PATENT DOCUMENTS

JP   49121171 A   11/1974
JP   61244094 A   10/1986
(Continued)

OTHER PUBLICATIONS

International Search Report (ISR) and Written Opinion dated Jun. 7, 2016 issued in International Application No. PCT/JP2016/058529.
(Continued)

*Primary Examiner* — Xiaoliang Chen
(74) *Attorney, Agent, or Firm* — Holtz, Holtz & Volek PC

(57) ABSTRACT

A method for producing an electronic device capable of connecting an electronic component precisely with a high-density circuit pattern includes applying a solution wherein conductive nanoparticles with a particle diameter of less than 1 μm and an insulating material are dispersed, or applying a solution wherein the conductive nanoparticles are coated with an insulating material layer, to a surface of an optically transparent substrate in a desired shape. A film of the conductive nanoparticles coated with the insulating material is formed. The electronic component is mounted on the film. The film is irradiated with light from a backside surface of the optically transparent substrate, and the light sinters the conductive nanoparticles. Accordingly, a first circuit pattern connected to electrodes of the electronic
(Continued)

component is formed, and the first circuit pattern is adhered to the electrodes of the electronic component.

6 Claims, 8 Drawing Sheets

(51) Int. Cl.
| | |
|---|---|
| H05K 3/10 | (2006.01) |
| H05K 1/14 | (2006.01) |
| H05K 1/18 | (2006.01) |
| H01B 1/22 | (2006.01) |
| H01L 23/00 | (2006.01) |
| B22F 1/02 | (2006.01) |
| H01L 23/498 | (2006.01) |

(52) U.S. Cl.
  CPC ........ *H01L 23/49822* (2013.01); *H01L 24/17* (2013.01); *H01L 24/32* (2013.01); *H01L 24/83* (2013.01); *H05K 1/145* (2013.01); *H05K 1/186* (2013.01); *H05K 3/102* (2013.01)

(58) Field of Classification Search
  USPC ................ 174/260; 257/40, 43, 59, 98, 773; 438/27, 29, 30, 49, 99, 158
  See application file for complete search history.

(56) References Cited

U.S. PATENT DOCUMENTS

| | | | | |
|---|---|---|---|---|
| 2004/0239861 | A1* | 12/2004 | Uchida | G02F 1/134309 349/149 |
| 2005/0276912 | A1* | 12/2005 | Yamamoto | H01L 21/28008 427/117 |
| 2006/0097368 | A1 | 5/2006 | Seko | |
| 2006/0163744 | A1* | 7/2006 | Vanheusden | B82Y 30/00 257/773 |
| 2006/0210705 | A1 | 9/2006 | Itoh et al. | |
| 2007/0178616 | A1* | 8/2007 | Arai | B82Y 30/00 438/29 |
| 2008/0093594 | A1* | 4/2008 | Honda | H01L 51/105 257/40 |
| 2008/0165513 | A1 | 7/2008 | Inoue et al. | |
| 2008/0286488 | A1 | 11/2008 | Li et al. | |
| 2009/0179230 | A1 | 7/2009 | Yamamoto et al. | |
| 2009/0274833 | A1 | 11/2009 | Li et al. | |
| 2010/0000762 | A1 | 1/2010 | Yang et al. | |
| 2010/0003791 | A1* | 1/2010 | Maeda | H01L 51/0022 438/158 |
| 2011/0096388 | A1* | 4/2011 | Agrawal | G02F 1/1506 359/268 |
| 2012/0119200 | A1* | 5/2012 | Ueno | C09K 11/02 257/40 |
| 2014/0327024 | A1* | 11/2014 | Ishihara | H01L 24/97 257/98 |
| 2015/0028085 | A1 | 1/2015 | Endoh et al. | |
| 2018/0070440 | A1 | 3/2018 | Hanya | |

FOREIGN PATENT DOCUMENTS

| | | |
|---|---|---|
| JP | 03020907 A | 1/1991 |
| JP | 10199705 A | 7/1998 |
| JP | 2006032916 A | 2/2006 |
| JP | 2006165517 A | 6/2006 |
| JP | 2008153536 A | 7/2008 |
| JP | 2010108696 A | 5/2010 |
| JP | 2011527089 A | 10/2011 |
| JP | 2014017364 A | 1/2014 |
| JP | 2014075461 A | 4/2014 |
| JP | 2014116315 A | 6/2014 |
| WO | 2004103043 A1 | 11/2004 |
| WO | 2013108408 A1 | 7/2013 |

OTHER PUBLICATIONS

Related U.S. Appl. No. 15/568,540; First Named Inventor: Akihiko Hanya; Title: "Resistor Production Method, Resistor and Electronic Device"; filed Oct. 23, 2017.

Related U.S. Appl. No. 15/560,439; First Named Inventor: Akihiko Hanya; Title: "Electronic Device, Method for Producing Same, and Circuit Substrate"; filed Sep. 21, 2017.

English language International Preliminary Report on Patentability dated Oct. 5, 2017 issued in International Application No. PCT/JP2016/058529.

* cited by examiner

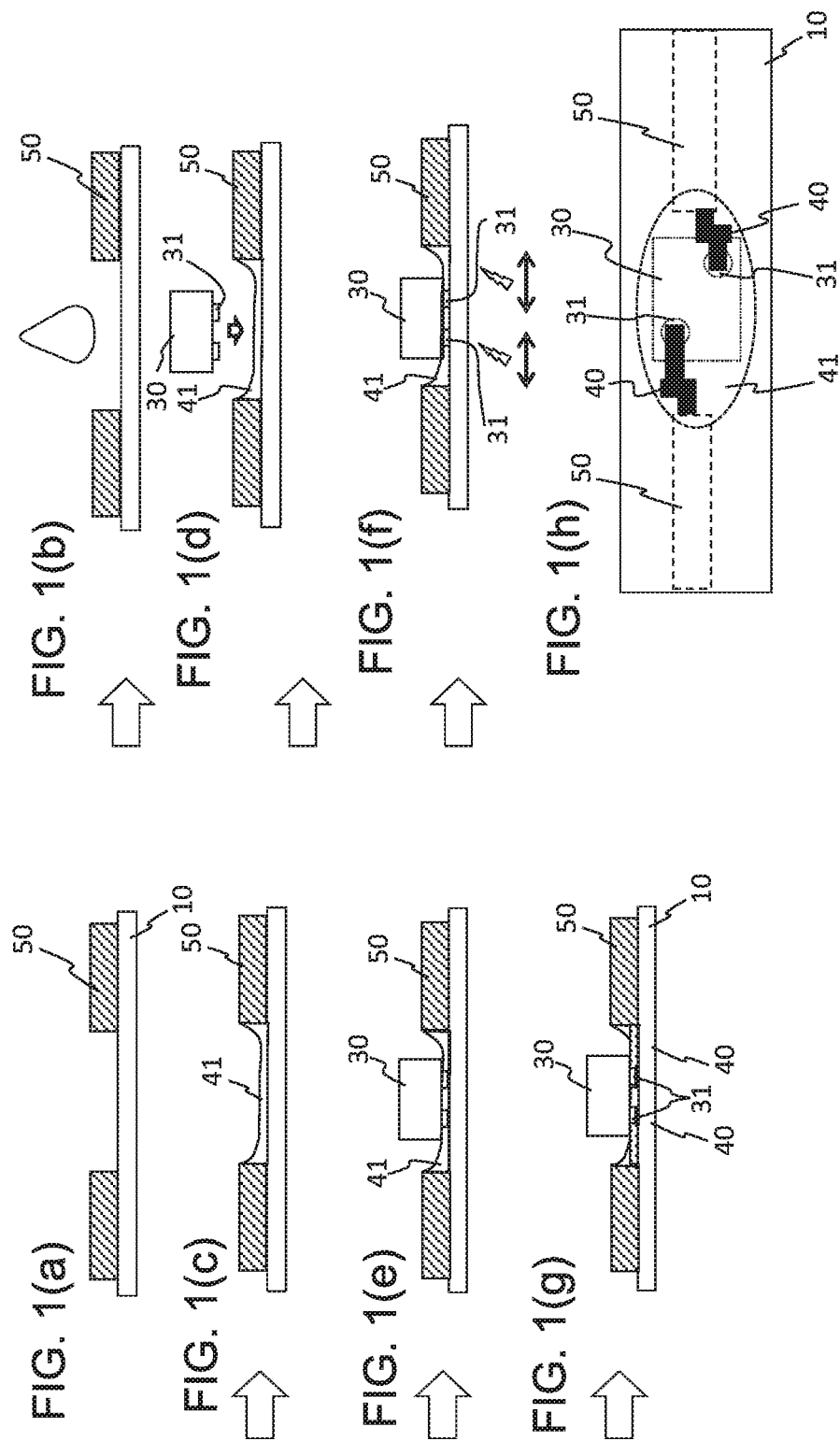

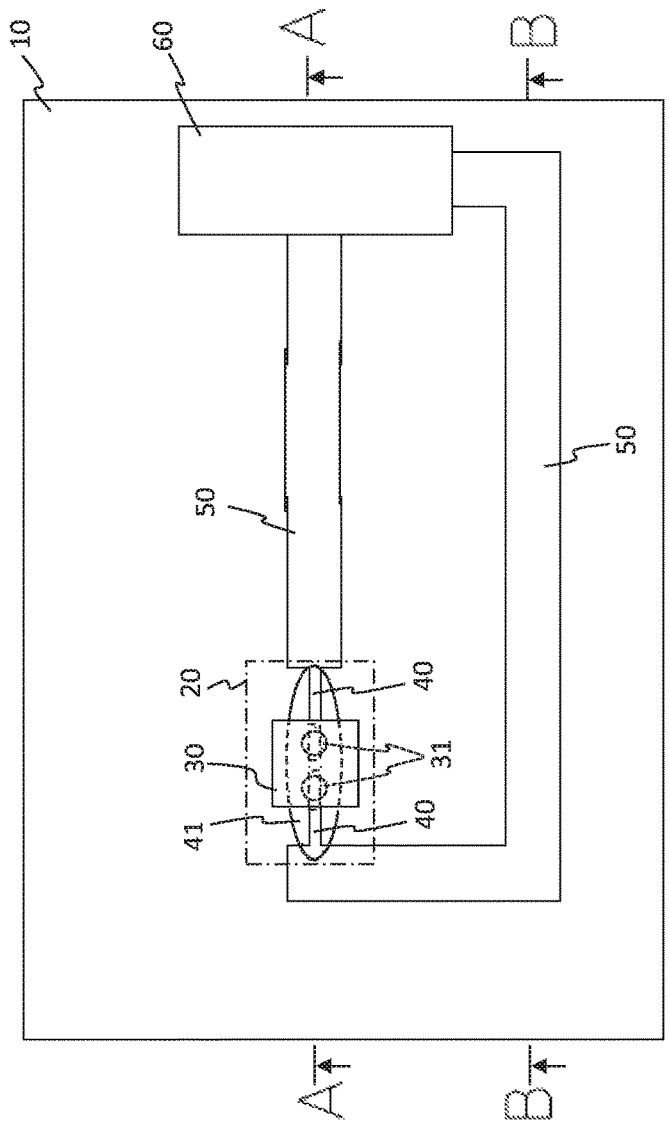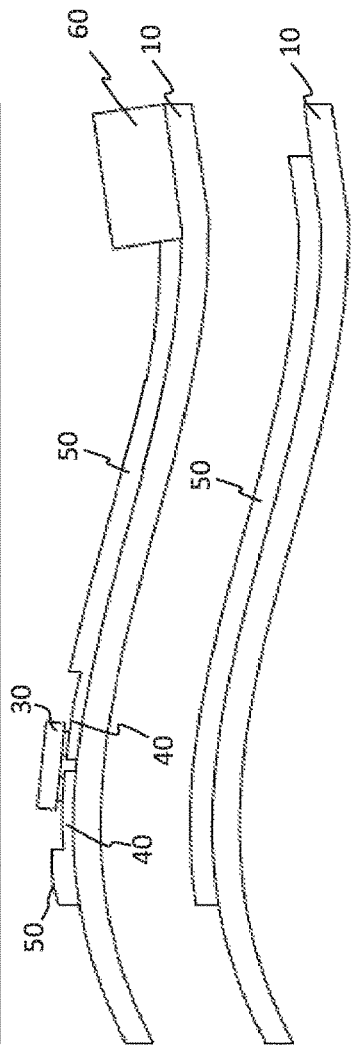
FIG. 2(a)
FIG. 2(b) A-A CROSS-SECTIONAL VIEW
FIG. 2(c) B-B CROSS-SECTIONAL VIEW

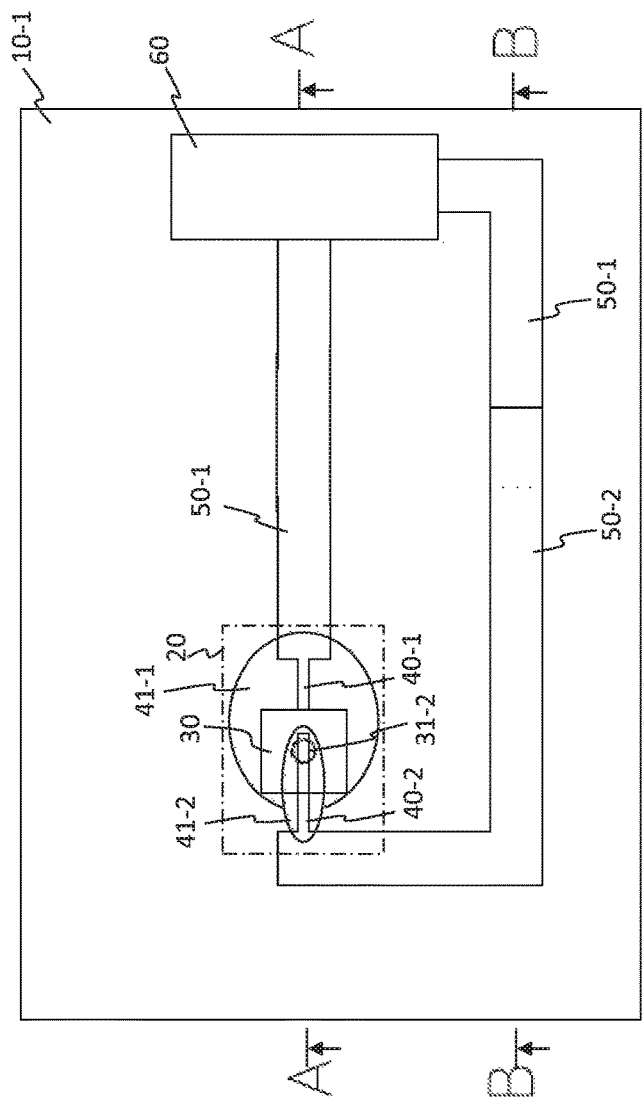
FIG. 4(a)
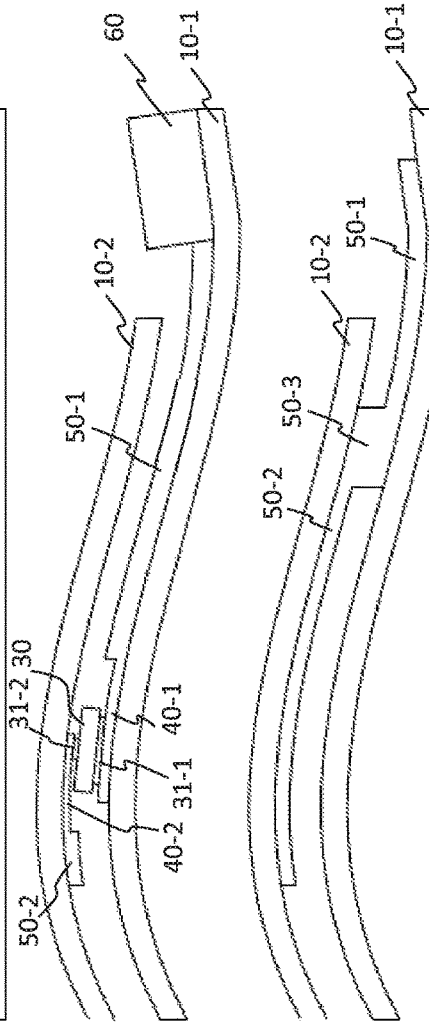
FIG. 4(b)
A-A CROSS-SECTIONAL VIEW UPSIDE AND DOWNSIDE WIRING
FIG. 4(c)
B-B CROSS-SECTIONAL VIEW UPSIDE AND DOWNSIDE WIRING

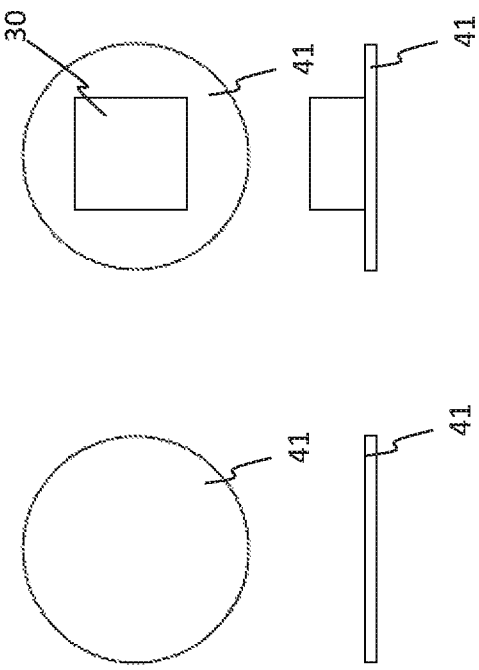

METHOD FOR PRODUCING ELECTRONIC DEVICE, AND ELECTRONIC DEVICE

TECHNICAL FIELD

The present invention relates to an electronic device having a substrate provided with a circuit pattern thereon.

BACKGROUND ART

For packaging an electronic device on a substrate, there is known a method of forming a bump ball by Au wire or the like, on a circuit pattern on the substrate, mounting an electronic component thereon, and adhering the electronic component to the circuit pattern, along with establishing electrical connection therebetween by heating and ultrasonic irradiation. There is also known a method of applying a material such as solder paste to the circuit pattern on the substrate, mounting the electronic component thereon, and adhering the electronic component to the circuit pattern, along with establishing electrical connection therebetween by heating and melting the solder.

There is widely known a method for forming a circuit pattern by copper-foil masking followed by etching. This method is, however, complicated in a production process and time consuming, and also expensive production equipment is required. In recent years, a technical field referred to as printed electronics is studied actively, where a circuit pattern is formed by printing, in order to simplify the production process and to reduce cost of the production equipment.

By way of example, in the Patent Document 1, there is disclosed a technique where a non-conductive film containing copper nanoparticles is deposited by using a printer such as an ink jet printer, and thus formed film is exposed to light from above, thereby fusing the copper particles, and then a conductive circuit is formed.

PRIOR ART DOCUMENT

Patent Document

Patent Document 1
Japanese Unexamined Patent Application Publication No. 2014-116315

DISCLOSURE OF THE INVENTION

Problems to be Solved by the Invention

In the method for packaging the electronic component on the circuit pattern using a bonding agent such as the solder paste, positional deviation may occur when the circuit pattern is formed, when the bonding agent is fed, and when the electronic component is mounted. Since the circuit pattern is designed in a size and in a shape (pattern gap) considering such positional deviation as described above, hampering high-density mounting of the electronic component.

When the solder paste is used as the bonding agent, forces of surface tension that is applied when the solder paste is melted, may act to pull the electronic component and cause positional deviation, and thus variations in precision may occur in mounting the electronic component.

On the other hand, when the bump ball is used, the positional deviation may not occur unlike the case of the solder paste melting, but the variations in mounting precision may occur, due to a degree of the precision in a pattern size when a wiring pattern is formed. In addition, since there is a limit in a formable pattern gap, there is also a limit in mounting the electronic component with high density.

An object of the present invention is to provide a method for producing the electronic device that allows the electronic component to be precisely connected to a high-density circuit pattern.

Means for Solving the Problems

In order to achieve the object as described above, a method for producing an electronic device according to the present invention comprises a first step applying to a surface of an optically transparent substrate in a desired shape, a solution where conductive nanosized particles with a particle diameter of less than 1 μm and an insulating material are dispersed, or a solution where the conductive nanosized particles coated with a layer of the insulating material are dispersed, and forming a film of the conductive nanosized particles coated with the insulating material. In a second step, an electronic component is mounted on the film. In a third step, the film is irradiated with light in a predetermined pattern, from the back surface of the optically transparent substrate, the conductive nanosized particles are sintered by the light, and a layer is formed by sintering the conductive nanosized particle in the predetermined pattern, thereby forming a first circuit pattern that is connected to electrodes of the electronic component, along with adhering the first circuit pattern to the electronic component.

Advantage of the Invention

According to the present invention, a high-density circuit pattern is formed by light irradiation, and simultaneously it is connected with the electronic component, thereby reducing deviation in mounting the electronic component on the circuit pattern.

BRIEF DESCRIPTION OF THE DRAWINGS

FIGS. 1(a) to 1(g) illustrate a production method of an electronic device according to the first embodiment, and FIG. 1(h) is a bottom view of the electronic device being produced;

FIG. 2(a) is a top view, FIG. 2(b) is a cross sectional view of FIG. 2(a) taken along line A-A, and FIG. 2(c) is a cross sectional view of FIG. 2(a) taken along line B-B, of an electronic device that can be produced according to the first embodiment;

FIGS. 4(a) to 4(c) illustrate the electronic device produced according to a fourth embodiment; FIG. 4(a) is a top view when a substrate 10-2 on the upper side is removed, FIG. 4(b) is a cross sectional view taken along line A-A, when the substrate 10-2 is not removed, and FIG. 4(c) is a cross sectional view taken along line B-B, when the substrate 10-2 is not removed;

FIGS. 7(a-1) to 7(c-2) illustrate a production method according to a sixth embodiment.

BEST MODE FOR CARRYING OUT THE INVENTION

Figure 3:
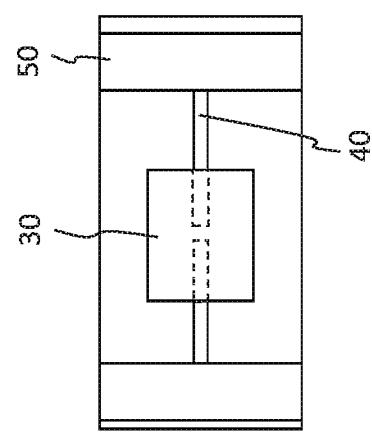
FIG. 3 is a top view of the electronic device when the film 41 is removed in the first embodiment.

A method for producing an electronic device according to a first embodiment will now be described.
<First Embodiment>
A method for producing the electronic device according to the first embodiment will be described, with reference to FIGS. 1(a) to 1(h).

In the present embodiment, an optically transparent substrate is employed as a substrate 10, and a first circuit pattern 40 is formed by irradiating the substrate with light, from the backside surface thereof.

As shown in FIG. 1(a), the substrate 10 is prepared, on which a second circuit pattern 50 being a thick film is formed in advance.

Next, a solution where conductive nanosized particles with a particle diameter equal to or less than 1 µm (hereinafter, referred tows conductive nanoparticles) and an insulating material are dispersed, or a solution where the conductive nanoparticles coated with a layer of the insulating material are dispersed, is applied in a desired shape to inside the region 20 on the surface of the substrate 10, as shown in FIG. 1(b). As shown in FIG. 1(c), the applied solution yields a smooth surface on the substrate 10, thereby forming a coated film (film 41). The ends of the film 41 are made continuous from the ends of the second circuit patterns 50. The film 41 is heated and dried as needed. The conductive nanoparticles are dispersed within the film 41, and the circumferences of the conductive nanoparticles are covered with the insulating material. Therefore, the film 41 is non-conductive.

Next, as shown in FIG. 1(d), an electronic component 30 is mounted in alignment with a predetermined position on the film 41, and as shown in FIG. 1(e), electrodes 31 of the electronic component 30 are brought into intimate contact with the film 41.

Next, as shown in FIG. 1(f), the film 41 is irradiated with light in a desired pattern from the backside surface of the substrate 10, the light sinters the conductive nanoparticles, and a layer of conductive nanoparticles (the first circuit pattern 40) in the desired pattern is formed. An irradiation pattern of the light includes a region on the film 41 which the electrodes 31 of the electronic component 30 come into contact with. Since positions of the electrodes 31 of the mounted electronic component 30 can be ensured, allowing the irradiation pattern to be determined on the basis of the positions of the electrodes, it is possible to reduce positional deviation between the circuit pattern 40 and the electronic component 30. The light forms the first circuit pattern 40 continuous from the second circuit pattern 50, and thus a region overlapping the second circuit pattern 50 is also exposed to light. This light irradiation allows the conductive nanoparticles to be fused at a temperature lower than the melting point of a bulk material constituting the particle. The insulating material layer on the circumference of the conductive nanoparticles is evaporated or softened by the light irradiation. Therefore, the fused conductive nanoparticles are fused to adjacent particles directly, or fused to the adjacent particles after bursting through the softened insulating material layer. Accordingly, the conductive nanoparticles are sintered with one another, and the region that is irradiated with light becomes the first circuit pattern 40 being electrically conductive. Then, as shown in FIG. 1(g), a pair of the first circuit patterns 40 are formed. It is noted that the conductive nanoparticles after exposed to light are in the state of particle-to-particle bonding, but each particle keeps its shape to some extent.

The conductive nanoparticles are fused when sintered, and also bonded to the electrodes 31 of the electronic component 30, thereby adhering the electrodes 31 to the first circuit pattern 40. In other words, light irradiation enables simultaneously, forming of the first circuit pattern 40 and bonding between the first circuit pattern 40 and the electrodes 31. In addition, bonding between the first circuit pattern 40 and the electrodes 31 is achieved, using only the circuit pattern forming material and the electrodes 31, without employing another bonding agent. The electrodes 31 are directly bonded to a layer obtained by sintering the conductive nanoparticles.

A wavelength of the radiated light to be selected and used, is absorbable by the conductive nanoparticles contained in the film 41 and hard to be absorbed by the substrate 10. The radiated light may have any wavelength, such as ultraviolet, visible, and infrared. When materials such as Ag, Cu, Au, and Pd are employed for the conductive nanoparticles, visible light in the range from 400 to 600 nm can be used, for instance. A predetermined pattern of the light irradiation may be formed by passing the light through a mask having an opening in the shape of the predetermined pattern. Alternatively, light beams collected into an irradiation diameter smaller than the predetermined pattern are employed, and the light beams are allowed to scan the predetermined pattern on the film 41, thereby enabling only the predetermined pattern to be exposed to light.

The region not exposed to the light on the film 41 is not sintered, and thus it remains non-conductive. This non-conductive film 41 may be removed in a subsequent step. For example, it is possible to remove the film 41 by using an organic solvent, or the like.

Accordingly, as shown in FIG. 1(h) that illustrates the substrate 10 viewed from the backside, it is possible to form the first circuit patterns 40 that connect the electrodes 31 of the electronic component 30 with the second circuit patterns 50, in the state where the electronic component 30 is mounted.

A conventional method may be employed as the method for forming the second circuit pattern 50 on the substrate 10. For example, it is possible to employ a method to form a metallic thin film on the substrate 10, and thereafter, patterning into a desired shape is performed by etching. It is alternatively possible that a solution where conductive particles are dispersed is printed on the substrate 10, so as to form a coating in the shape of the second circuit pattern 50. Then, only heat is applied, or heat and pressure are applied, thereby sintering the conductive particles to form the second circuit pattern 50.

With reference to FIGS. 2(a), 2(b), and 2(c), the electronic device produced by the aforementioned production method will now be described.

The electronic device as shown in FIG. 2 comprises a substrate 10 provided with circuit patterns and an electronic component 30. On the substrate 10, there is provided the region 20 for mounting the electronic component 30, and within the region 20, the first circuit pattern 40 is placed that is electrically connected to the electronic component 30. There is placed the second circuit pattern 50 on the substrate 10, and the second circuit pattern 50 is connected to the first circuit pattern 40 on the circumferential edge of the region 20. The second circuit pattern 50 supplies current to the first circuit pattern 40 from a power source 60 that is placed outside the region 20.

A part or all of the first circuit pattern 40 is made up of a layer containing the conductive nanoparticles with the particle diameter of less than 1 μm. Since only the part irradiated with the light is sintered to form the first circuit pattern 40, it is possible to form the first circuit pattern 40 into a desired shape with high density, being suitable for the size and arrangement of the electrodes of the electronic component 30, achieving a fine and thin line of the first circuit pattern 40 that is narrower than the second circuit pattern 50. Since the region not exposed to the light on the film 41 is not sintered, it maintains non-conductivity. Therefore, it remains thereon, continuous from the first circuit pattern 40. It is noted that the non-conductive region that is not sintered on the film 41 may be kept remaining, or it may be removed in a subsequent step.

Specifically, as shown in FIGS. 2(a) and 2(b), the second circuit patterns 50 are disposed at both sides of the region 20 that is configured to mount the electronic component 30. At least one pair of the first circuit patterns 40 are disposed within the region 20, and they are connected respectively with the second circuit patterns 50 on both sides of the region 20. The non-conductive layer 41 is placed between the pair of the first circuit patterns 40. The electrodes 31 of the electronic component 30 are directly adhered to the pair of the first circuit pattern 40.

As shown in FIG. 2(b), the second circuit pattern 50 is thicker than the first circuit pattern 40. In the present embodiment, the first circuit pattern 40 is formed only in the region 20 for mounting the electronic component 30 that needs fine wiring, and the outside of the region 20 comprises the second circuit pattern 50 that is made up of a thick film, thereby reducing resistance and allowing large current to be supplied to the electronic component 30.

In FIG. 2, the power source 60 is mounted on the substrate 10, but the power source 60 is not necessarily mounted on the substrate 10. By way of example, the substrate 10 may be provided with a connector instead of the power source 60. In this case, a power source that is not mounted on the substrate 10 may be connected to the connector via a cable, or the like. The connector is attached to the second circuit pattern. A generator system such as a solar battery may be employed as the power source 60.

As shown in FIGS. 2(b) and 2(c), the substrate 10 may have a curved shape. In this case, the first circuit pattern 40 and the second circuit pattern 50 are arranged along the surface of thus curved substrate 10. In the present embodiment, the first circuit pattern 40 and the second circuit pattern 50 can be formed, by applying a film containing conductive particles and then sintering the film by light irradiation. Therefore, by curving the substrate 10 prior to the sintering step, the circuit patterns can be formed easily on the curved substrate 10, without any wire break or line thinning.

The substrate 10 may be made of any material that is capable of supporting the first circuit pattern 40 and the second circuit pattern 50, at least the surface of the material having insulating properties, provided with translucency enabling light irradiation onto the film containing the conductive particles when the first circuit pattern is formed, and also resistant to the light irradiation when the first circuit pattern 40 is formed. By way of example, there may be employed a material such as a polyethylene terephthalate (PET) substrate, a polyethylene naphthalate (PEN) substrate, a glass epoxy substrate, a paper phenol substrate, a flexible print substrate, a ceramic substrate, a glass substrate, and a metal substrate with a surface coated with an insulating layer. This means that the substrate allows at least a part of radiated light to pass through. In addition, a film-like substrate may also be used as the substrate 10 of the present embodiment.

As a material of the conductive nanoparticles constituting the first circuit pattern 40, at least one of the conductive metal and conductive metal oxide such as Ag, Cu, Au, Pd, ITO, Pt, and Fe may be employed. When the second circuit pattern 50 is formed by sintering the conductive particles, similar to the first circuit pattern 40, at least one of the aforementioned conductive metal and conductive metal oxide may be employed as the material of the conductive particles.

As the insulating material, at least contained in the non-conductive film 41 that is adjacent to the first circuit pattern 40 and used for coating the conductive nanoparticles, at least one of the followings can be employed; a resin material such as styrene resin, epoxy resin, silicone resin, and acryl resin; inorganic substances such as $SiO_2$, $Al_2O_3$, and $TiO_2$; and hybrid materials containing both organic and inorganic substances. The thickness of the insulating material layer for coating the conductive nanoparticles in the film 41 is preferably from around 1 nm to 10,000 nm. It is because, if the insulating material layer is significantly thin, a property of withstand voltage of the non-conductive film 41 is decreased. On the other hand, if the insulating material layer is significantly thick, electric conductivity of the first circuit pattern 40 after sintered by light irradiation is decreased, whereas increasing thermal resistance value.

The first circuit pattern 40 contains conductive particles with the particle diameter of 0. 01 μm to 1 μm. The wiring width of the first circuit pattern 40 (sintered portion) may be equal to 1 μm or larger, for instance. The first circuit pattern 40 may be formed with the thickness around 1 nm to 10 μm. The electric resistance of the first circuit pattern 40 is preferably equal to or less than $10^{-4}$ Ω/cm, and in particular, low resistance equal to the order of $10^{-6}$ Ω/cm is more preferable.

Any component may be employed as the electronic component 30. By way of example, a light emitting element (LED, LD), a light receiving element, an integrated circuit, and a display element (liquid crystal display, plasma display, EL display, or the like) may be employed. In FIG. 1, only one electronic component 30 is provided on the substrate 10. However, it is of course possible to provide two or more regions 20, so as to mount two or more electronic components 30. In this case, the second circuit pattern 50 may be formed so that plural electronic components 30 can be connected via a desired circuit pattern, such as in series and in parallel.

As discussed so far, in the present embodiment, after the electronic component 30 is mounted on the film 41 on the optically transparent substrate 10, the backside surface of the optically transparent substrate 10 is irradiated with light, thereby directly forming the first circuit pattern 40 with a desired fine pattern, along with connected to the electrodes 31 of the electronic component 30. Therefore, light irradiation is performed on the basis of the location of thus already mounted electronic component 30, and it is possible to prevent a positioning error between the electronic component 30 and the first circuit pattern 40, and faulty connections due to positional deviation can be reduced. In addition, at the time of light irradiation, the electronic component 30 can be bonded to the first circuit pattern 40, simultaneously with forming the first circuit pattern 40, and it is not necessary to prepare a bonding agent separately. Therefore, occurrence of conventional problems such as positional deviation and quantitative variation in feeding the bonding agent can be prevented.

Since the fine-line first circuit pattern can be formed in high density according to the light irradiation, this enables mounting of the electronic component 30 with high density.

Furthermore, since it is not necessary to design the circuit pattern with prediction of positional deviation in mounting the electronic component 30 and deviation in feeding the bonding agent (position and volume), the first circuit pattern 40 can be designed with higher definition, enabling the electronic component 30 to be mounted with higher density.

In addition, the first circuit pattern can be formed, along with connected to the second circuit pattern 50 being a thick film. Therefore, large current from the second circuit pattern 50, low resistance and thick film, is allowed to be supplied to the electronic component 30 via the first circuit pattern 40.

In the present embodiment, after the step of FIG. 1(*f*), it is also possible to dissolve the non-conductive film 41 by a solvent, such as an organic solvent, so as to remove the film on the circumference of the first circuit pattern 40. Accordingly, as shown in FIG. 3, only the first circuit pattern 40 can be placed under the electronic component 30.

In the description above, in order to form the first circuit pattern 40, the region where the film 41 is formed in the steps as shown in FIGS. 1(*b*) and 1(*c*), is one region including both the pair of the first circuit patterns 40 (see FIG. 1(*h*)), but the region may be separated into two, including the pair of the first circuit patterns 40, respectively. In this case, the films 41 respectively in the two regions may be formed, being continuous from the second circuit pattern 50.

[Second Embodiment]

In the second embodiment, the second circuit pattern 50 is formed by light irradiation.

In the second embodiment, a part or all of the second circuit pattern 50 may comprise a layer obtained by sintering conductive particles. In this situation, conductive nanoparticles with the particle diameter of less than 1 μm and microsized conductive particles with the particle diameter of 1 μm or larger (hereinafter, referred to as "conductive microparticles") are mixed and used as the conductive particles. Accordingly, when the conductive particles are irradiated with light, the conductive nanoparticles are fused earlier, and then bonded to the surrounding conductive microparticles. Therefore, using the conductive nanoparticles as starting points, the conductive microparticles can be sintered at a lower temperature than the bulk by the light irradiation. Therefore, using the mixture of the conductive microparticles and the conductive nanoparticles may allow a thick layer to be formed relatively easily, and further, they are sintered by light irradiation to make the second circuit pattern.

The second circuit pattern 50 contains conductive particles with the particle diameter from 1 μm to 100 μm. The second circuit pattern 50 may be formed to have the wiring width of 10 μm or larger, for example, around 100 μm. The second circuit pattern 50 may be formed to have the thickness around 1 μm to 100 μm, for example, around 20 μm. The electric resistance of the second circuit pattern 50 may be preferably equal to or less than $10^{-4}$ Ω/cm, and in particular, low resistance equal to the order of $10^{-6}$ Ω/cm is more preferable.

A production method will be described. Firstly, a substrate 10 is prepared.

Next, a solution where conductive nanoparticles, conductive microparticles, and an insulating material are dispersed in a solvent; or a solution where the conductive nanoparticles and the conductive microparticles coated with a layer of the insulating material are dispersed in a solvent, are prepared. As the solvent, an organic solvent or water may be used.

The solution described above is applied to the region on the surface of the substrate 10 in a desired pattern, where the second circuit pattern 50 is to be formed. The solution being applied forms a coated film. The coated film is heated and dried as needed. The conductive nanoparticles and conductive microparticles are dispersed in the coated film, and the circumference of each particle is covered with the insulating material. Under these circumstances, the coated film is non-conductive.

Next, the coated film is exposed to light in the shape of the second circuit pattern 50. The light allows the conductive nanoparticles to fuse at a lower temperature than the conductive microparticles, and they are fused with adjacent conductive nanoparticles and conductive microparticles. As thus described, since sintering occurs from the nanoparticles serving as starting points, it is possible to cause sintering at a temperature lower than the bulk. It is further possible to cause sintering only within the desired range in the thickness direction of the coated film. Accordingly, the second circuit pattern 50 in the desired shape can be formed.

As wavelengths of the radiated light, the wavelengths being absorbed by the conductive nanoparticles and the conductive microparticles contained in the coated film, are selected and used. The shape of the second circuit pattern 50 used for the light irradiation, can be formed by a mask having a predetermined opening. It is alternatively possible that light beams collected into an irradiation diameter smaller than the wiring width of the second circuit pattern 50 are employed, and the light beams are allowed to scan, thereby enabling only the second circuit pattern 50 to be exposed to light.

Since sintering does not occur in the region on the coated film, where not exposed to light, this region remains non-conductive. It is noted that the non-conductive region that is not sintered on the film 41 may be kept remaining, or it may be removed in a subsequent step.

In the aforementioned production method, it is described that the coated film is formed in a range wider than the region corresponding to the second circuit pattern 50, and only the region corresponding to the second circuit pattern 50 is irradiated with light. It is alternatively possible to employ a printing method that forms the coated film by printing a solution where conductive particles are dispersed, in the shape of the second circuit pattern 50. In this case, the coated film formed by printing is entirely exposed to light, thereby forming the second circuit pattern 50.

After forming the second circuit pattern 50 according to the steps as described above, the production method of the first embodiment is performed to produce the electronic device.

<Third Embodiment>

In the second method, it is described that the second circuit pattern 50 is formed on the substrate 10 and thereafter, the production method according to the first embodiment is performed. Is the third production method, the coated film serving as the second circuit pattern 50 according to the second production method is formed, and then, without irradiated with light, the production method according to the first embodiment is performed to form the film 41 serving as the first circuit pattern 40.

Then, photonic sintering of the second circuit pattern 50 and the first circuit pattern 40 is performed sequentially or simultaneously. The region serving as the second circuit pattern 50 is irradiated with light having a wavelength absorbed by the conductive particles in the coated film for the second circuit pattern 50, and the region serving as the first circuit pattern 40 is irradiated with light having a wavelength absorbed by the conductive nanoparticles in the film 41. Strength of the radiated light is adjusted to be the strength that allows each of the second circuit pattern 50 and the first circuit pattern 40 to be sintered.

Thereafter, the production method according to the first embodiment is performed, so as to complete the electronic device.

As thus described, sintering of the second circuit pattern 50 and the first circuit pattern 40 by light irradiation is performed sequentially or simultaneously, and thus the light irradiation steps in the entire production process can be performed at one time. Accordingly, the production efficiency is improved.

In the second production method, the sequence of the step of forming the second circuit pattern 50 and the step of forming the first circuit pattern 40 may be altered, and the second circuit pattern 50 may be formed after forming the first circuit pattern 40. Similarly, in the third embodiment, the sequence of forming the coated film of the second circuit pattern 50 and forming the film 41 of the first circuit pattern 40 may be altered, and the coated film of the second circuit pattern 50 may be formed after forming the film 41 of the first circuit pattern 40. Thereafter, both circuit patterns are irradiated with light sequentially or simultaneously.

<Fourth Embodiment>

Figure 5:
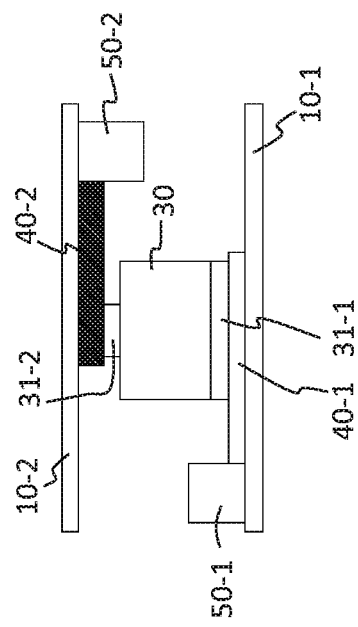
FIG. 5 is an enlarged view of the electronic device produced according to the fourth embodiment.

With reference to FIGS. 4 and 5, the production method according to the fourth embodiment will be described. In the fourth embodiment, the electronic component 30 is provided with electrodes 31, respectively on the upper surface and on the bottom surface. It is configured such that the electronic component 30 is placed between two substrates 10-1 and 10-2 from above and below.

According to the steps of the first embodiment as shown in FIGS. 1(*a*) to 1(*g*), while the first circuit pattern 40-1 is formed, the electrode 31-1 on the bottom surface of the electronic component 30 is adhered to the first circuit pattern 40-1 on the substrate 10-1.

On the other hand, the steps as shown in FIGS. 1(*a*) to 1(*c*) are applied to the other substrate 10-2, and the film 41-2 is formed. The substrate 10-2 is mounted on the electronic component 30, in such a manner that the film 41-2 is brought into contact with the electrode 31-2 on the upper surface of the electronic component 30. Then, the film 41-2 on the upper side is irradiated with light in a predetermined pattern, from the back surface (upper surface) of the substrate 10-2. Accordingly, the first circuit pattern 40-2 is formed, being connected to the electrode 31-2 on the upper surface of the electrode component 30. Simultaneously, the first circuit pattern 40-2 is adhered to the electrode 31-2 on the upper surface of the electronic component 30.

There is hereby produced an electronic device with the electronic component 30 placed between the two substrates 10-1 and 10-2.

In this configuration, the first circuit pattern 40-1 on the lower-side substrate 10-1 is connected to the electrode 31 of the electronic component 30, prior to establishing connection with the upper-side substrate 10-1, but the present invention is not limited to this sequence. Preferably, the side that requires higher positional precision takes priority in establishing connection.

In the configuration as shown in FIG. 4, the second circuit pattern 50-1 formed on the substrate 10-1 is vertically coupled to the second circuit pattern 50-2 formed on the substrate 10-2 via vertical continuity 50-3. After forming coated films serving as the second circuit patterns 50-1 and 50-2, the substrate 10-1 and 10-2 are superimposed one on another, placing the second circuit pattern 50-1 into contact with the second circuit pattern 50-2, and the substrates are irradiated with light and sintered, thereby forming the vertical continuity 50-3 simultaneously with forming the second circuit patterns 50-1 and 50-2.

<Fifth Embodiment>

Figure 6C:
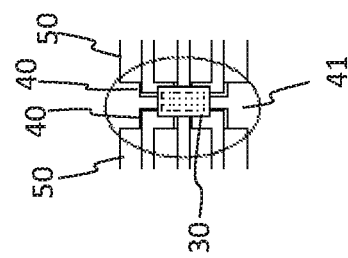
FIGS. 6(a) to 6(c) illustrate a production method according to a fifth embodiment.
Figure 6B:
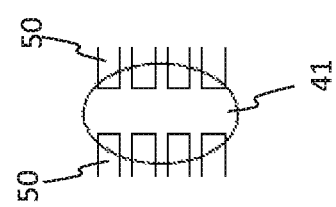
Figure 6A:
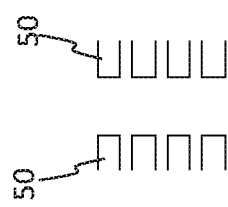

As a fifth embodiment, there will be described that the electronic component 30 is provided with numerous electrodes, such as the case where the electronic component 30 is an integrate circuit. As shown in FIG. 6(*a*), a substrate with numerous second circuit patterns 50 being formed thereon is prepared. Then, a solution containing conductive nanoparticles is applied in such a manner that the second circuit patterns 50 as shown in FIG. 6(*a*) are entirely connected, and then a film 41 as shown in FIG. 6(*b*) is formed. Next, as shown in FIG. 6(*c*), the electronic component 30 is mounted on the surface of the film 41, and a pattern that connects the electrodes of the electric component 30 with the second circuit patterns 50 is irradiated with light from the back surface of the optically transparent substrate 10, and then sintering is performed. Accordingly, it is possible to form the first circuit pattern 40, simultaneously with adhesion between the first circuit pattern 40 and the electrodes.

<Sixth Embodiment>

As a sixth embodiment, there will be described an example that the first circuit pattern 40 is formed only within the area of the electronic component 30.

As shown in FIGS. 7(*a*-1) and 7(*a*-2), a solution containing conductive nanoparticles is applied to the region where the electronic component 30 is mounted on the optically transparent substrate 10, and a film 41 is formed. Next, as shown in FIGS. 7(*b*-1) and 7(*b*-2), the electronic component 30 is mounted on the surface of the film 41. As shown in FIGS. 7(*c*-1) and 7(*c*-2), a pattern connecting the electrodes of the electronic component 30 and the second circuit pattern (not illustrated) is irradiated with light from the back surface of the substrate (not illustrated), and sintering is performed. Accordingly, the first circuit pattern 40 is formed simultaneously with adhering the first circuit pattern 40 to the electrodes of the electronic component 30.

The present embodiment enables electrical connection and adhesion of the electronic component 30 within an area smaller than a region for placing the electrodes (terminal area), which has been hardly achieved by a normal soldering process. In addition, this configuration may avoid contact between a region other than the electrodes 31 on the electronic component 30, and the first circuit pattern 40, thereby reducing a problem such as electrical short circuit.

<Seventh Embodiment>

As a seventh embodiment, there will be described a modification example of the fourth embodiment which is shown in FIG. 5.

In the structure as shown in FIG. 5, the corner of the electronic component 30 is close to the first circuit pattern 40-2. Therefore, there is a possibility that an edge or a burr of a semiconductor in the electronic component 30 may come into contact with the first circuit pattern 40-2, in the case where the substrate 10-2 or the electronic component 30 is mounted in a tilted position, and this may cause electrical short circuit.

Figure 8:
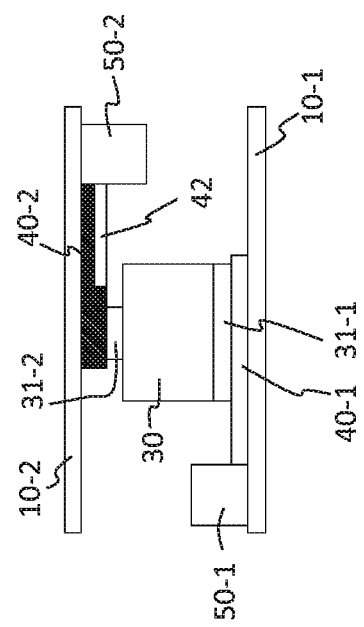
FIG. 8 is an enlarged view of the electronic device of a modification example of FIG. 5, according to a seventh embodiment.

In order to prevent this short circuit, in the present embodiment as shown in FIG. 8, when the back surface (upper surface) of the substrate 10-2 is irradiated with light to form the first circuit pattern 40-2, the light outputted to a region near the corner of the electronic component 30 is weakened so as to reduce the thickness obtained by sintering. Accordingly, the non-conductive part 42 is formed.

With this configuration, even when the electronic component 30 is tilted, it may come into contact with the non-conductive part 42, and thus preventing electrical short circuit.

If the substrate 10 is curved, it is preferable to bend the substrate 10 prior to forming the second pattern 50 so as to prevent wire break or line thinning of the second circuit pattern 50, in the production method according to the first embodiment. In the production methods according to the second to the third embodiments, the substrate 10 is curved before the first light irradiation step, and thereby preventing wire break of the first and the second circuit patterns.

Effects produced from the aforementioned embodiments are collectively described as the following; according to each embodiment, it becomes possible to draw the first circuit pattern 40 by thinner-line patterns than a Gravure printing method, thereby achieving high-density wiring and enabling high-density packaging. In addition, since the first circuit pattern 40 can be drawn with such thin lines, this enables downsizing of the electronic component 30 to be mounted.

Since it becomes possible to establish wiring of (to form) the first circuit pattern 40 after mounting the electronic component 30, positional precision in mounting the electronic component 30 can be improved. In addition, as described in the seventh embodiment, electrical connection and adhesion are enabled between the first circuit pattern and the electrodes within the area smaller than the terminal area of the electronic component 30, which has been hardly achieved by the normal soldering process. In addition, it becomes possible to mount the electronic component 30 on the substrate 10 simultaneously with continuous fixing thereon, thereby improving take time in production.

According to the present embodiment, it is possible to mount various electronic components on the substrate 10 with high density and with a high degree of precision, and then the electronic device can be produced by collectively packaged through less production steps. In addition, since the circuit pattern can be easily modified by light irradiation, design changes may be addressed easily.

The electronic device of the present embodiment is applicable to any device that is equipped with an electronic component on a substrate. By way of example, it is applicable to a device such as an instrument panel of a vehicle, and a monitor of a gaming machine. Since the substrate is allowed to bend, it is applicable to a wearable (body wearable) electronic device (such as glasses, a watch, a display, and medical equipment), and a curved display.

DESCRIPTION OF SYMBOLS

10 . . . substrate, 20 . . . region for mounting electronic component, 30 . . . electronic component, 31 . . . electrode, 40 . . . the first circuit pattern, 41 . . . film, 50 . . . the second circuit pattern, 60 . . . electrode

What is claimed is:

1. A method for producing an electronic device, the method comprising:
    step 1: applying a solution wherein conductive nanosized particles with a particle diameter of less than 1 μm and an insulating material are dispersed, or applying a solution wherein the conductive nanosized particles coated with a layer of the insulating material are dispersed, to a surface of an optically transparent substrate in a desired shape, and forming a film of the conductive nanosized particles coated with the insulating material;
    step 2: mounting an electronic component on the film; and
    step 3: irradiating the film with light in a predetermined pattern, from a back surface of the substrate, sintering the conductive nanosized particles by the light, and forming a layer obtained by sintering the conductive nanosized particles in the predetermined pattern, thereby forming a first circuit pattern that is connected to electrodes of the electronic component, along with adhering the first circuit pattern to the electrodes of the electronic component.

2. The method for producing the electronic device according to claim 1, further comprising:
    step 4: applying a solution wherein the conductive nanosized particles with the particle diameter of less than 1 μm, conductive microsized particles with a particle diameter of 1 μm or larger, and the insulating material are dispersed, or applying a solution wherein the conductive nanosized particles and the conductive microsized particles, each coated with the layer of the insulating material, are dispersed, to the surface of the substrate in a desired shape, and forming a second film of the conductive nanosized particles and the conductive microsized particles coated with the insulating material; and
    step 5: irradiating the second film with light in a predetermined pattern, from the back surface of the substrate, sintering the conductive nanosized particles and the microsized particles by the light, and forming a second circuit pattern.

3. The method for producing the electronic device according to claim 2, wherein step 4 and step 5 are performed prior to step 1.

4. The method for producing the electronic device according to claim 2, wherein:
    step 4 is performed prior to step 1; and
    the light irradiation in step 5 is performed continuous from or simultaneously with the light irradiation in step 3.

5. The method for producing the electronic device according to claim 1, wherein:
    the electronic component comprises the electrodes respectively on an upper surface and on a lower surface thereof; and
    after adhering the electrode on the lower surface of the electronic component to the first circuit pattern on the substrate according to step 3, a second substrate to which step 1 is applied in advance is mounted on the electronic component such that the film comes into contact with the electrode on the upper surface; and
    the film on the second substrate is irradiated with light in a predetermined pattern from a back surface of the second substrate, so as to form the first circuit pattern that is connected to the electrode on the upper surface of the electronic component, along with adhering the first circuit pattern to the electrode on the upper surface of the electronic component.

6. The method for producing the electronic device according to claim 2, wherein:
    step 4 is performed after step 1 and prior to step 3, and the light irradiation in step 5 is performed continuous from or simultaneously with the light irradiation in step 3.

* * * * *